(12) United States Patent
Kuo et al.

(10) Patent No.: US 11,887,976 B2
(45) Date of Patent: Jan. 30, 2024

(54) LAND-SIDE SILICON CAPACITOR DESIGN AND SEMICONDUCTOR PACKAGE USING THE SAME

(71) Applicant: MEDIATEK INC., Hsin-Chu (TW)

(72) Inventors: Che-Hung Kuo, Hsinchu (TW); Yi-Jyun Lee, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 177 days.

(21) Appl. No.: 17/494,851

(22) Filed: Oct. 6, 2021

(65) Prior Publication Data

US 2022/0130814 A1 Apr. 28, 2022

Related U.S. Application Data

(60) Provisional application No. 63/105,379, filed on Oct. 26, 2020.

(51) Int. Cl.
| | |
|---|---|
| *H01L 23/498* | (2006.01) |
| *H01L 27/01* | (2006.01) |
| *H01L 25/065* | (2023.01) |
| *H01L 23/58* | (2006.01) |
| *H01L 49/02* | (2006.01) |

(52) U.S. Cl.
CPC .......... *H01L 27/01* (2013.01); *H01L 25/0657* (2013.01); *H01L 23/49816* (2013.01); *H01L 23/585* (2013.01); *H01L 28/40* (2013.01); *H01L 2225/0652* (2013.01); *H01L 2225/06517* (2013.01); *H01L 2225/06572* (2013.01)

(58) Field of Classification Search
None
See application file for complete search history.

(56) References Cited

U.S. PATENT DOCUMENTS

| | | | | |
|---|---|---|---|---|
| 5,016,080 | A | * | 5/1991 | Giannella ............. H01L 27/118 257/E27.105 |
| 2006/0216955 | A1 | * | 9/2006 | Swenson ............... H01C 17/006 438/800 |
| 2011/0073996 | A1 | * | 3/2011 | Leung ............... H01L 23/49575 257/676 |
| 2017/0287853 | A1 | | 10/2017 | Kim |
| 2018/0294230 | A1 | * | 10/2018 | Dabral .................... H01L 23/58 |
| 2018/0315550 | A1 | * | 11/2018 | Ryou ....................... H01G 4/33 |
| 2018/0350790 | A1 | * | 12/2018 | Shin ........................ H01L 28/87 |

(Continued)

FOREIGN PATENT DOCUMENTS

| | | | | |
|---|---|---|---|---|
| KR | 20220023087 | A | * 3/2022 | ............. H01L 28/90 |
| WO | 2020/211093 | A1 | 10/2020 | |

OTHER PUBLICATIONS

Translation of Choi, KR-20220023087-A, 2022 (Year: 2022).*

*Primary Examiner* — Marcos D. Pizarro
*Assistant Examiner* — William Henry Anderson
(74) *Attorney, Agent, or Firm* — Winston Hsu

(57) ABSTRACT

A semiconductor package includes a package substrate; a semiconductor die mounted on a top surface of the package substrate; a plurality of conductive elements disposed on a bottom surface of the package substrate; and a land-side silicon capacitor disposed on the bottom surface of the package substrate and surrounded by the plurality of conductive elements. The land-side silicon capacitor includes at least two silicon capacitor unit dies adjoined to each other with an integral scribe line region.

10 Claims, 2 Drawing Sheets

(56) References Cited

U.S. PATENT DOCUMENTS

2018/0358292 A1   12/2018  Kong
2020/0098853 A1*  3/2020  Haraguchi .............. H01L 28/91
2020/0137889 A1   4/2020  Yook
2021/0327864 A1* 10/2021  Buot ................ H01L 23/49541

* cited by examiner

LAND-SIDE SILICON CAPACITOR DESIGN AND SEMICONDUCTOR PACKAGE USING THE SAME

CROSS REFERENCE TO RELATED APPLICATION

This application claims priorities from U.S. provisional application No. 63/105,379 filed on Oct. 26, 2020, the disclosure of which is included in its entirety herein by reference.

BACKGROUND

The present disclosure relates generally to the field of semiconductor packaging. More particularly, the present disclosure relates to a novel land-side silicon capacitor design and semiconductor package using the same.

System on-a-chip (SoC) is required to operate at high speed along with low power consumption. To meet the demands, on-chip transistors are scaled down, operating at lower power supply voltages. As a result, current density also increases. Fast switching of transistors as well as the high current density produce large voltage drop. The voltage drop affects operation of the circuit as power supply noise. Additionally, lower supply voltage relatively lowers the design margin for voltage fluctuations. Therefore, the power supply noise is one of the most serious concerns in the modern low voltage integrated circuits.

On the conventional flip-chip packages, multi-layer ceramic capacitors (MLCC) are placed near the conductive elements. MLCC works as a "dam" that temporarily charges and discharges electricity, which regulates the current flow in a circuit and prevents electromagnetic interference between components. Because thickness of single dielectric and number of stacked layers are related with capacity of electricity, technology for thinning single layer and stacking more layers is important. However, the effect of MLCC is limited by the parasitic elements including equivalent series inductance (ESL) and equivalent series resistance (ESR).

To deal with thin devices or modules, it is desired to dispose small capacitors between the conductive elements, which can reduce the impact of power/ground balls reduction. It is also desired to dispose small capacitors between the conductive elements, which can supply current quickly in a stable manner to high-speed application processor of mobile devices, and reduce tape-out efforts.

SUMMARY

One object of the present invention is to provide a land-side silicon capacitor design and semiconductor package using the same, in order to solve the above-mentioned prior art problems or shortcomings.

One aspect of the disclosure provides a silicon capacitor comprising at least two silicon capacitor unit dies, wherein the at least two silicon capacitor unit dies are adjoined to each other with an integral scribe line region.

According to some embodiments, each of the at least two silicon capacitor unit dies is surrounded by a die seal ring.

According to some embodiments, the at least two silicon capacitor unit dies have substantially the same in-die capacitor structure.

According to some embodiments, the integral scribe line region has a width of about 30-100 micrometers.

According to some embodiments, each of the at least two silicon capacitor unit dies has at least two terminals.

Another aspect of the disclosure provides a semiconductor package including a package substrate; a semiconductor die mounted on a top surface of the package substrate; a plurality of conductive elements disposed on a bottom surface of the package substrate; and a land-side silicon capacitor disposed on the bottom surface of the package substrate and surrounded by the plurality of conductive elements. The land-side silicon capacitor includes at least two silicon capacitor unit dies adjoined to each other with an integral scribe line region.

According to some embodiments, each of the at least two silicon capacitor unit dies is surrounded by a die seal ring.

According to some embodiments, the at least two silicon capacitor unit dies have substantially the same in-die capacitor structure.

According to some embodiments, the semiconductor die is mounted on the top surface of the package substrate in a flip-chip manner.

According to some embodiments, the semiconductor die is electrically connected to the package substrate through a plurality of connecting elements.

According to some embodiments, plurality of connecting elements comprises copper pillar, micro-bumps or solder bumps.

According to some embodiments, the semiconductor die is over-molded with an encapsulant.

According to some embodiments, the two silicon capacitor unit dies are connected in parallel through the package substrate.

According to some embodiments, the integral scribe line region has a width of about 30-100 micrometers.

According to some embodiments, each of the at least two silicon capacitor unit dies has at least two terminals.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
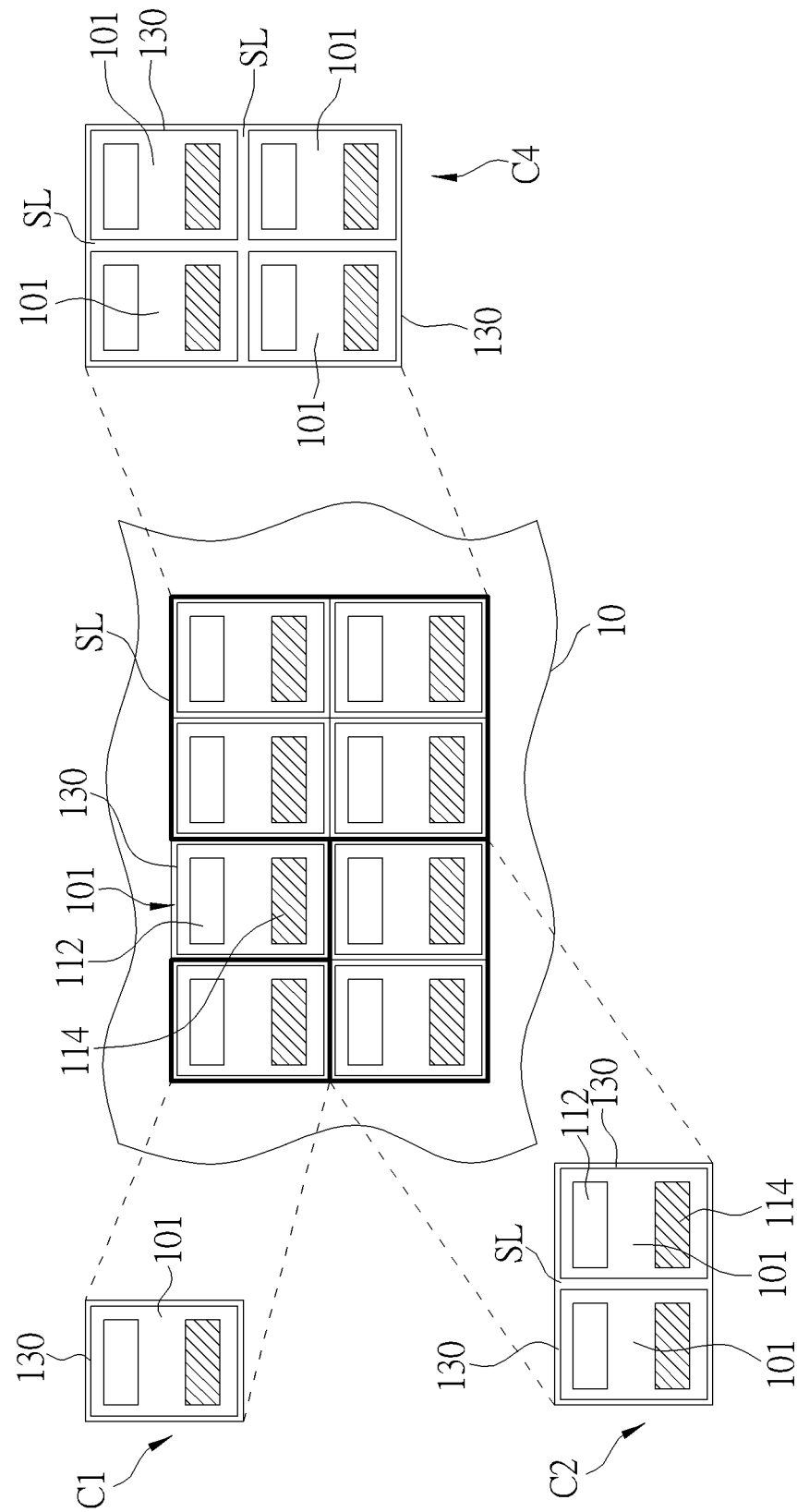
FIG. 1 is a schematic diagram showing a flexible land-side silicon capacitor design according to one embodiment of the invention.

FIG. 1 is a schematic diagram showing a flexible land-side silicon capacitor design according to one embodiment of the invention. As shown in FIG. 1, a semiconductor wafer 10 such as a silicon wafer is provided. On the semiconductor wafer 10, a plurality of silicon capacitor unit dies 101 are fabricated. According to an embodiment of the disclosure, the silicon capacitor unit dies 101 have substantially the same in-die capacitor structure and therefore substantially the same capacitance, for example, 0.1 µF, but not limited thereto. For the same of simplicity, the detailed capacitor structure of each silicon capacitor unit die 101 is not explicitly shown. It is understood that silicon capacitor unit dies 101 may be fabricated with semiconductor manufacturing processes or techniques including but not limited to deposition such as physical vapor deposition (PVD) or chemical vapor deposition (CVD), sputtering, plating, etching, lithography, polishing, or the like.

According to an embodiment of the disclosure, each of the silicon capacitor unit dies 101 may have two terminals 112 and 114, which function as an anode electrode and a cathode electrode of a capacitor, respectively. According to an embodiment of the disclosure, the terminals 112 and 114 may be fabricated at an aluminum layer deposited on the semiconductor wafer 10. According to an embodiment of the disclosure, the terminals 112 and 114 may be electrically connected to underlying capacitor plates, respectively, with metal interconnect structures. According to an embodiment of the disclosure, the capacitor plates may be fabricated with copper processes, but is not limited thereto. According to some embodiments of the disclosure, at least one of the capacitor plates may be fabricated in a deep trench form that is recessed into a silicon substrate. According to some embodiments of the disclosure, each of the silicon capacitor unit dies 101 may have multiple terminals (more than two terminals 112 and 114) function as anode electrodes and cathode electrodes of the capacitor.

According to an embodiment of the disclosure, each of the silicon capacitor unit dies 101 may be surrounded by a die seal ring 130, which is also fabricated with semiconductor manufacturing processes or techniques. The die seal ring 130 is situated between integral scribe line regions SL and the fabricated in-die capacitor structure (not explicitly shown). The silicon capacitor unit dies 101 are silicon-based and may be fabricated on a semiconductor substrate such as a silicon substrate. After the fabrication of the capacitor structure is completed, a wafer dicing process is performed to cut the wafer with blade or laser thereby forming individual silicon capacitor unit dies 101.

According to an embodiment of the disclosure, the silicon capacitor unit dies 101 on a wafer may be cut and partitioned into different land-side silicon capacitors, for example, land-side silicon capacitors C1, C2 and C4 with different capacitances. According to an embodiment of the disclosure, for example, the land-side silicon capacitor C1 is composed of a single silicon capacitor unit die 101. According to an embodiment of the disclosure, for example, the land-side silicon capacitor C2 is composed of two silicon capacitor unit dies 101 adjoined together through the scribe line region SL. According to an embodiment of the disclosure, for example, the land-side silicon capacitor C4 is composed of four silicon capacitor unit dies 101 arranged in a 2×2 array and adjoined together through the scribe line region SL. According to an embodiment of the disclosure, for example, the land-side silicon capacitor C1 may have a capacitance of 0.1 µF, the land-side silicon capacitor C2 may have a capacitance of 0.2 µF, and the land-side silicon capacitor C4 may have a capacitance of 0.4 µF.

It is advantageous to use the present disclosure because the land-side silicon capacitors C1, C2 and C4 with different capacitances are composed of the same silicon capacitor unit dies 101, and therefore the design flexibility is increased, the effort of taping out can be saved, and the production cost can be reduced.

Figure 2:
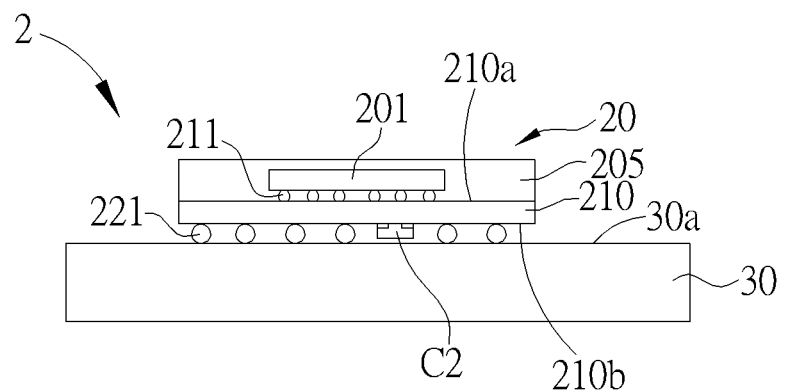
FIG. 2 is a schematic, cross-sectional diagram showing an exemplary electronic device comprising a land-side silicon capacitor as depicted in FIG. 1 according to an embodiment of the disclosure.
Figure 3:
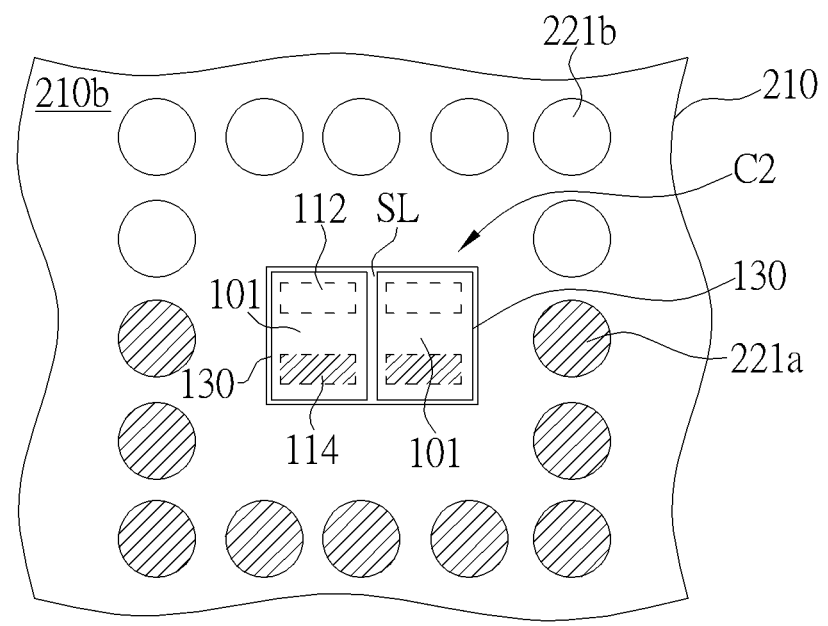
FIG. 3 is an enlarged, partial bottom view of the land-side silicon capacitor and the conductive elements around the land-side silicon capacitor in FIG. 2.

Please refer to FIG. 2 and FIG. 3. FIG. 2 is a schematic, cross-sectional diagram showing an exemplary electronic device 2 comprising a land-side silicon capacitor C2 as depicted in FIG. 1 according to an embodiment of the disclosure. FIG. 3 is an enlarged, partial bottom view of the land-side silicon capacitor C2 and the conductive elements 221 around the land-side silicon capacitor in FIG. 2.

As shown in FIG. 2, electronic device 2 such as a semiconductor assembly may comprise a semiconductor package 20 mounted on a top surface 30a of a base 30. According to an embodiment of the disclosure, the semiconductor package 20 comprises a semiconductor die 201 mounted on a top surface 210a (chip side) of a package substrate 210 in a flip-chip manner, for example. According to another embodiment of the disclosure, the base 30 could be a printed circuit board (PCB), but not limited. According to the other embodiment of the disclosure, the semiconductor assembly could be flip-chip package, wire-bonding package or fan-out flip-chip package and not limited.

For the sake of simplicity, the detailed structures of the base 30 and the package substrate 210 are omitted. It is understood that the base 30 and the package substrate 210 comprise interconnect structures or traces, which are known in the art.

According to an embodiment of the disclosure, the semiconductor die 201 may be electrically connected to the package substrate 210 through a plurality of connecting elements 211 such as copper pillar, micro-bumps or solder bumps and may be over-molded with an encapsulant 205 such as epoxy resin. On the land side of the package substrate 210, that is, the bottom surface 210b of the package substrate 210, a plurality of conductive elements 221 such as ball grid array (BGA) balls and at least a land-side silicon capacitor C2 are disposed. The semiconductor package 20 is electrically connected to the base 30 through the plurality of conductive elements 221. The land-side silicon capacitor C2 may be mounted on the bottom surface 210b of the package substrate 210 by using surface mount techniques.

It is understood that the exemplary land-side silicon capacitor C2 may be replaced with the land-side silicon capacitor C4 in FIG. 2 when a greater capacitance is needed. In some embodiments, the bottom surface 210b of the package substrate 210 may be disposed with the land-side silicon capacitors C1, C2, C4 or a combination thereof depending upon the design requirements.

As shown in FIG. 3, as previously described, the land-side silicon capacitor C2 is composed of two adjoined silicon capacitor unit dies 101, each is surrounded by a die seal ring 130. The two adjoined silicon capacitor unit dies 101 have substantially the same in-die capacitor structure. The silicon capacitor unit die 101 and the die seal ring 130 are fabricated with semiconductor manufacturing processes or techniques. The die seal ring 130 is situated between integral scribe line regions SL and the fabricated in-die capacitor structure. The silicon capacitor unit dies 101 are silicon-based and may be fabricated on a semiconductor substrate such as a silicon substrate, which is not cut through during the wafer dicing process.

According to an embodiment of the disclosure, as shown in FIG. 3, the two adjacent silicon capacitor unit dies 101 and the die seal ring 130 between the two adjacent silicon capacitor unit dies 101 are fabricated integrally on the same semiconductor substrate. Therefore, the die seal ring 130 is also a silicon-based structure. According to an embodiment of the disclosure, for example, the adjacent die seal rings 130 between the two adjacent silicon capacitor unit dies 101 may have an interval spacing of about 30-100 micrometers, for example, 80 micrometers, that is to say, the integral scribe line region SL between the two adjacent silicon capacitor unit dies 101 may have a width of about 30-100 micrometers, for example, 80 micrometers.

According to an embodiment of the disclosure, the land-side silicon capacitor C2 may be surrounded by power conductive elements 221a and ground conductive elements 221b, which may be electrically connected to power grid and ground plane, respectively. The terminals 112 and 114 of the land-side silicon capacitor C2 may be mounted on the respective pads on the bottom surface 210b of the package substrate 210. The in-die capacitor structures of the two silicon capacitor unit dies 101 may be connected in parallel through the package substrate 210. By providing such configuration, it is beneficial to provide a land-side silicon capacitor having lower effective series inductance (ESL) and effective series resistance (ESR) and higher capacitance.

Though the silicon capacitor C2 described in the above embodiments is a land-side silicon capacitor mounted on the bottom surface 210b of the package substrate 210, but it is not limited. According to another embodiment of the disclosure, the silicon capacitor C2 may be mounted on the top surface 210a of the package substrate 201. In other embodiments, the silicon capacitor C2 may be mounted on the top surface 30a or the back surface of the base 30, depending on the required capacitance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a package substrate;
   a semiconductor die mounted on a top surface of the package substrate;
   a plurality of conductive elements disposed on a bottom surface of the package substrate; and
   a land-side silicon capacitor disposed on the bottom surface of the package substrate and surrounded by the plurality of conductive elements, wherein the land-side silicon capacitor comprises at least two silicon capacitor unit dies adjoined to each other with an integral scribe line region, wherein the land-side silicon capacitor is surrounded by an annular, ring-shaped arrangement of conductive terminals comprising a first half-ring of ground conductive terminals arranged in proximity to anode terminals of the at least two silicon capacitor unit dies and a second half-ring of power conductive terminals arranged in proximity to cathode terminals of the at least two silicon capacitor unit dies.

2. The semiconductor package according to claim 1, wherein each of the at least two silicon capacitor unit dies is surrounded by a die seal ring.

3. The semiconductor package according to claim 1, wherein the at least two silicon capacitor unit dies have substantially the same in-die capacitor structure.

4. The semiconductor package according to claim 1, wherein the semiconductor die is mounted on the top surface of the package substrate in a flip-chip manner.

5. The semiconductor package according to claim 1, wherein the semiconductor die is electrically connected to the package substrate through a plurality of connecting elements.

6. The semiconductor package according to claim 5, wherein the plurality of connecting elements comprises copper pillar, micro-bumps or solder bumps.

7. The semiconductor package according to claim 1, wherein the semiconductor die is over-molded with an encapsulant.

8. The semiconductor package according to claim 1, wherein the at least two silicon capacitor unit dies are connected in parallel through the package substrate.

9. The semiconductor package according to claim 1, wherein the integral scribe line region has a width of about 30-100 micrometers.

10. The silicon capacitor according to claim 1, wherein each of the at least two silicon capacitor unit dies has at least two terminals.

* * * * *